(12) United States Patent
Weng et al.

(10) Patent No.: US 9,953,809 B2
(45) Date of Patent: Apr. 24, 2018

(54) APPARATUS FOR COATING A FILM IN A CONTAINER AND METHOD FOR COATING THE FILM

(71) Applicant: INDUSTRIAL TECHNOLOGY RESEARCH INSTITUTE, Hsinchu County (TW)

(72) Inventors: Chih-Chiang Weng, Hsinchu (TW); Chen-Der Tsai, Hsinchu (TW); Yu-Ming Wang, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 10 days.

(21) Appl. No.: 14/972,985

(22) Filed: Dec. 17, 2015

(65) Prior Publication Data

US 2017/0062189 A1 Mar. 2, 2017

(30) Foreign Application Priority Data

Sep. 2, 2015 (TW) .............................. 104128964 A (51) Int. Cl.
*C23C 16/00* (2006.01)
*H01J 37/32* (2006.01)
(Continued)

(52) U.S. Cl.
CPC ........ *H01J 37/32394* (2013.01); *B65D 25/14* (2013.01); *C23C 16/045* (2013.01);
(Continued)

(58) Field of Classification Search
CPC ............................................... H01J 37/32394
See application file for complete search history.

(56) References Cited

U.S. PATENT DOCUMENTS 6,294,226 B1 9/2001 Shimamura
8,883,257 B2 11/2014 Nakaya et al.
(Continued)

FOREIGN PATENT DOCUMENTS

CN 103882412 A 6/2014
EP 1229068 A1 * 8/2002 .............. C08J 7/123
(Continued)

OTHER PUBLICATIONS

Kodama et al., Properties of Amorphous Carbon Films Synthesized by Atmospheric Pressure Glow Plasma CVD Method, Journal of Photopolymer Science and Technology, Jun. 2006, pp. 673-678.
(Continued)

*Primary Examiner* — Parviz Hassanzadeh
*Assistant Examiner* — Michelle Crowell
(74) *Attorney, Agent, or Firm* — Rabin & Berdo, P.C.

(57) ABSTRACT

An apparatus for coating a film in a container and a method for coating a film are provided. The apparatus includes a cylindrical housing having a containing space penetrating through both ends thereof; a first arc-shaped electrode and a second arc-shaped electrode surrounding and covering an outer side of the cylindrical housing with a gap formed between the first and second arc-shaped electrodes such that the first arc-shaped electrode is free from electrically connected to the second arc-shaped electrode; a first conductive ring and a second conductive ring surrounding on the first and second arc-shaped electrodes, respectively; an upper supporting seat and a lower supporting seat disposed at the both ends of the cylindrical housing, respectively, to form a sealed environment for the containing space; and a valve component furnished at the upper supporting seat and inserted into the container for providing a processing gas in a film-coating process.

16 Claims, 8 Drawing Sheets

(51) Int. Cl.
  *B65D 25/14*  (2006.01)
  *C23C 16/26*  (2006.01)
  *C23C 16/507* (2006.01)
  *C23C 16/04*  (2006.01)

(52) U.S. Cl.
  CPC ............ *C23C 16/26* (2013.01); *C23C 16/507* (2013.01); *H01J 37/3244* (2013.01); *H01J 37/32467* (2013.01); *H01J 37/32513* (2013.01); *H01J 37/32541* (2013.01); *H01J 37/32568* (2013.01); *H01J 37/32577* (2013.01); *H01J 37/32715* (2013.01); *H01J 37/32743* (2013.01); *H01J 37/32834* (2013.01); *H01J 2237/3321* (2013.01)

(56) References Cited

U.S. PATENT DOCUMENTS

| | | | |
|---|---|---|---|
| 2005/0284295 A1* | 12/2005 | Ohta | B03C 3/011 96/15 |
| 2006/0051539 A1 | 3/2006 | Yamasaki et al. | |
| 2008/0206477 A1 | 8/2008 | Rius | |
| 2010/0096393 A1 | 4/2010 | Asahara et al. | |
| 2010/0192354 A1* | 8/2010 | Horimizu | F16B 5/0275 29/525.12 |
| 2012/0045592 A1* | 2/2012 | Kumar | B65D 23/02 427/577 |
| 2012/0312233 A1* | 12/2012 | Yi | C23C 16/045 118/723 MP |
| 2015/0108031 A1 | 4/2015 | Asahara et al. | |

FOREIGN PATENT DOCUMENTS

| | | | |
|---|---|---|---|
| JP | 02243766 A | * | 9/1990 |
| JP | 2005313939 A | * | 11/2005 |
| JP | 2006008254 A | * | 1/2006 |
| TW | 201110831 A | | 3/2011 |
| TW | I348879 | | 9/2011 |
| WO | WO-2008041386 A1 | | 4/2008 |

OTHER PUBLICATIONS

Sakurai et al., Hardness and surface roughness of hydrogenated amorphous carbon films synthesized by atmospheric pressure plasma enhanced CVD method with various pulse frequencies, Surface and Coatings Technology, 2013, pp. 460-464.

Tsubone et al., Gas barrier properties and periodically fractured surface of thin DLC films coated on flexible polymer substrates, Surface and Coatings Technology, 2007, pp. 6431-6436.

Sakata et al., Effects of substrate temperature on physical properties of amorphous carbon film synthesized under atmospheric pressure, Surface and Coatings Technology, 2010, pp. S414-S417.

Suzuki et al., Diamond-like carbon films synthesized under atmospheric pressure synthesized on PET substrates, Diamond and Related Materials, 2009, pp. 990-994.

Welle et al., SiOx layer as functional barrier in polyethylene terephthalate (PET) bottles against potential contaminants from post-consumer recycled PET, Food Additives and Contaminants: Part A, 2008, pp. 788-794.

Boutroy et al., Hydrogenated amorphous carbon film coating of PET bottles for gas diffusion barriers, Diamond and Related Materials, 2006, pp. 921-927.

Sakudo et al., Surface modification of PET film by plasma-based ion implantation, Nuclear Instruments and Methods in Physics Research Section B: Beam Interactions with Materials and Atoms, 2003, pp. 687-690.

* cited by examiner

APPARATUS FOR COATING A FILM IN A CONTAINER AND METHOD FOR COATING THE FILM

CROSS-REFERENCE TO RELATED APPLICATION

The present disclosure is based on, and claims priority from Taiwan Application Serial Number 104128964, filed on Sep. 2, 2015, the disclosure of which is hereby incorporated by reference herein in its entirety.

TECHNICAL FIELD

This disclosure relates to film coating technical fields, and, more particularly, to an apparatus and a method for coating a film.

BACKGROUND

Beer, red wine, and high unit price energy drink are generally contained in glass containers. The high gas barrier characteristic of the glass blocks oxygen outside the bottle from entering the bottle and carbon dioxide inside the bottle from leakage, in order to maintain the quality, flavor or freshness of the contents in the bottle. A glass bottle is heavy and fragile, and costs high in manufacturing, loading and transferring processes. In recent years, plastic containers come to the market, and replace the glass bottle gradually. However, plastic containers suffer from a poor gas barrier characteristic. For example, PET has a gas barrier characteristic as low as $10^{-1}$ g/bottle·day. Plastic bottles with such a low gas barrier characteristic can neither ensure the quality of carbonated beverage contained therein, nor be mass-produced. Therefore, plastic containers with a film coated therein come to the market.

Currently, inner and outer electrodes are used to coat a film. The inner electrode, which is made of a conductive material, is inserted into the body of a plastic container. As plasma stimulates and dissociates a diamond like carbon (DLC) precursor, a nano-scaled DLC film will be formed on an inner wall of the body of the plastic container. Such a technique has a drawback. Since the inner electrode is in direct contact with the coating environment, when the coating process is performed for a period of time, containments will be accumulated on the inner electrode. The containments may fall and remain in the bottle, and contaminate the contents contained in the bottle.

The inner electrodes have to be cleaned from time to time, in order to prevent the coated film from falling and remaining in the bottle. Such an action increases the cost.

Therefore, how to overcome the problems of existing prior art that spend a great amount of time and money to clean the inner electrodes is becoming one of the most urgent issues in the art.

SUMMARY

The disclosure discloses an apparatus for coating a film in a container, comprising: a cylindrical housing having a containing space to contain the container, the containing space penetrating through both ends of the cylindrical housing; a first arc-shaped electrode and a second arc-shaped electrode surrounding and covering an outer side of the cylindrical housing with a gap formed between the first arc-shaped electrode and the second arc-shaped electrode such that the first arc-shaped electrode is free from electrically connecting to the second arc-shaped electrode; a first conductive ring fixed on the first arc-shaped electrode and a second conductive ring fixed on the second arc-shaped electrode, wherein the first conductive ring and the second conductive ring surround on the first arc-shaped electrode and the second arc-shaped electrode; an upper supporting seat and a lower supporting seat disposed at the both ends of the cylindrical housing to form a sealed environment for the containing space; and a valve component furnished at the upper supporting seat and inserted into the container for providing a processing gas in a film-coating process.

The disclosure further discloses a method for coating a film, comprising: subjecting a containing space of a cylindrical housing to contain a container; turning on a motor for driving an electrode assembly including a first arc-shaped electrode and a second arc-shaped electrode to rotate, wherein the first arc-shaped electrode is connected to a radio frequency power and the second arc-shaped electrode is connected to a ground; turning on vacuum equipment to draw gas from the containing space of the cylindrical housing to pump down a pressure in the containing space to a coating pressure; providing a gas duct to guide processing gas into the container; and turning on the RF power to excite the processing gas to generate plasma between the first arc-shaped electrode and the second arc-shaped electrode to coat a film on an inner wall of the container.

BRIEF DESCRIPTION OF DRAWINGS

The disclosure can be more fully understood by reading the following detailed descriptions of the embodiments, with reference made to the accompanying drawings, wherein:

FIGS. 3C(*a*) and 3C(*b*) are cross-sectional views of a cylinder-like configuration formed by the first and second arc-shaped electrodes of two embodiments according to the disclosure, respectively;

DETAILED DESCRIPTION

In the following detailed descriptions, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
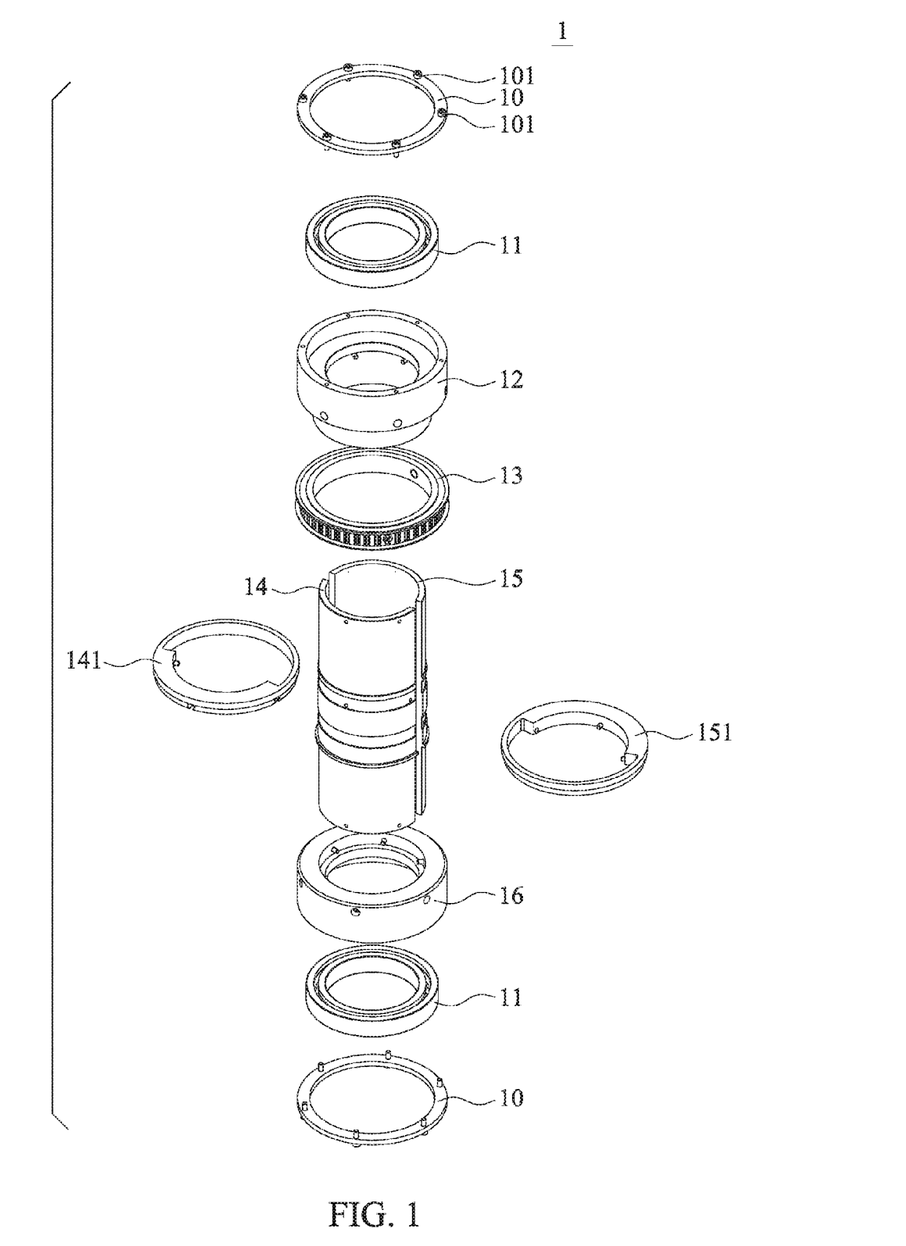
FIG. 1 is an exploded view of an electrode assembly of an embodiment according to the disclosure.
Figure 2:
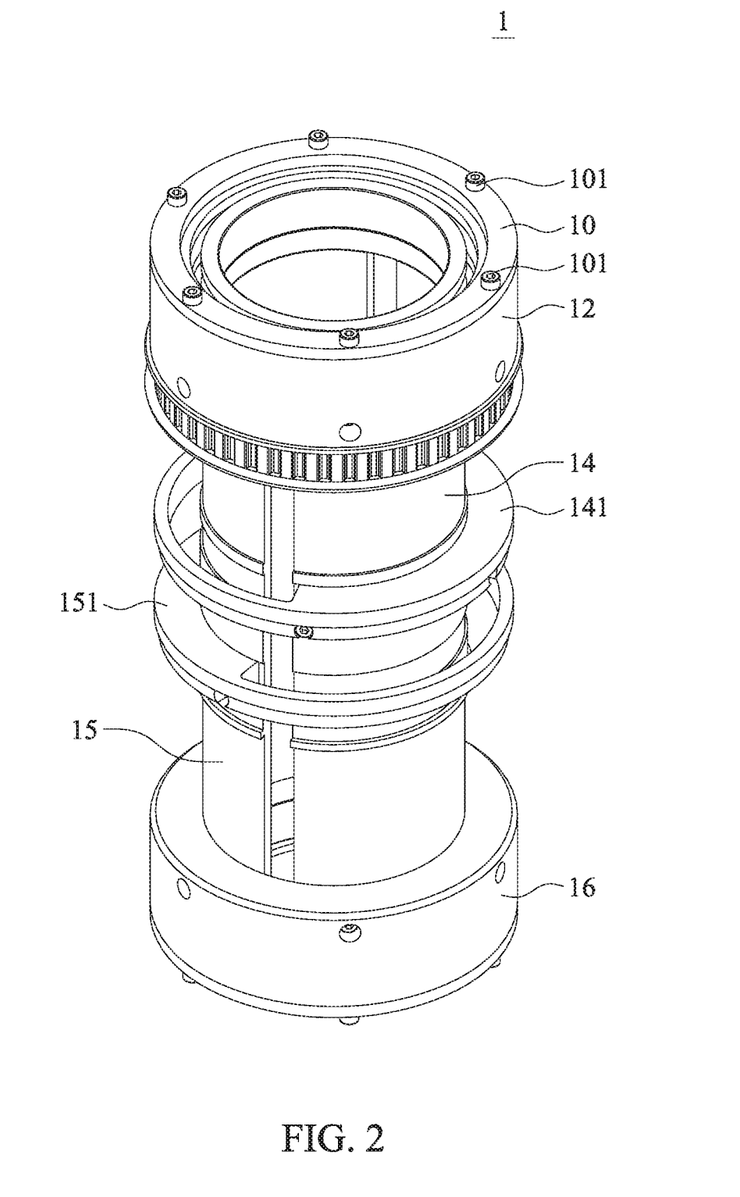
FIG. 2 is an assembled view of the electrode assembly of FIG. 1.

Refer to FIGS. 1 and 2. FIG. 1 is an exploded view of an electrode assembly 1 of an embodiment according to the disclosure. FIG. 2 is an assembled view of the electrode assembly 1 of FIG. 1.

As shown in FIG. 1, the electrode assembly 1 comprises, from top to bottom, screw bolts 101, a ball bearing fixture 10, a ball bearing 11, a first fixture ring 12, a belt pulley 13, a first arc-shaped electrode 14, a first conductive ring 141, a second arc-shaped electrode 15, a second conductive ring 151, a second fixture ring 16, a ball bearing 11, and a ball bearing fixture 10.

As shown in FIG. 1, the electrode assembly 1 comprises two ball bearing fixtures 10, which are disposed on top and bottom of the electrode assembly 1 and fix the two (top and bottom) ball bearings 11 to the first fixture ring 12 and the second fixture ring 16, respectively. In an embodiment, the ball bearing fixtures 10 can be fixed to the first fixture ring 12 and the second fixture ring 16 by the screw bolts 101, or by other mechanisms. In an embodiment, the ball bearing fixtures 10, the first fixture ring 12 and the second fixture ring 16 are made of an insulating material. The ball bearings 11 are designed to improve the stability of the electrode assembly 1 when rotating.

The belt pulley 13 can be fixed to the first fixture ring 12 by the screw bolts 101, to allow the belt pulley 13 to drive the electrode assembly 1 to rotate. The rotating mechanism of the electrode assembly 1 will be described in the following paragraphs.

The first arc-shaped electrode 14 faces the second arc-shaped electrode 15, and the first arc-shaped electrode 14 and the second arc-shaped electrode 15 are assembled with a gap formed therebetween, to have a pipe shape, for example. The first arc-shaped electrode 14 is not electrically connected to the second arc-shaped electrode 15 due to the formation of the gap. In other words, the first arc-shaped electrode 14 and the second arc-shaped electrode 15 are assembled to form a cylinder-like configuration, and the cylinder-like configuration has the gap formed between the first arc-shaped electrode 14 and the second arc-shaped electrode 15 such that the first arc-shaped electrode 14 is free from electrically connecting to the second arc-shaped electrode 15. In an embodiment, the first arc-shaped electrode 14 and the second arc-shaped electrode 15 are made of a conductive material. In another embodiment, the first arc-shaped electrode 14 is connected to an RF power supply, and the second arc-shaped electrode 15 is a ground electrode.

Figure 3A:
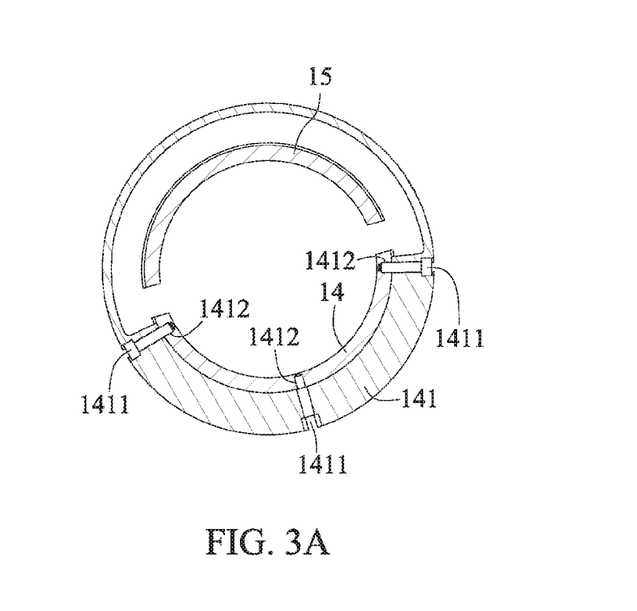
FIG. 3A is a cross-sectional view of first and second arc-shaped electrodes that are assembled of an embodiment according to the disclosure.

Please refer to FIG. 3A, which is an exploded view of the first arc-shaped electrode 14 and the second arc-shaped electrode 15 that are assembled as an embodiment according to the disclosure. The first conductive ring 141 is fixed to the first arc-shaped electrode 14, and surrounds the cylinder-like configuration formed by the first arc-shaped electrode 14 and the second arc-shaped electrode 15. The second conductive ring 151 is fixed to the second arc-shaped electrode 15 in the same fixing mechanism as that of the first conductive ring 141 and the first arc-shaped electrode 14, and surrounds the cylinder-like configuration formed by the first arc-shaped electrode 14 and the second arc-shaped electrode 15. In the following paragraphs, only the first conductive ring 141 and the first arc-shaped electrode 14 are described to illustrate the fixing mechanism.

In an embodiment, the first conductive ring 141 can be locked and fixed to screw threads 1412 of the first arc-shaped electrode 14 by perforating the screw bolts 111 through perforations 1411, to electrically connect the first conductive ring 141 with the first arc-shaped electrode 14. The second conductive ring 151 and the second arc-shaped electrode 15 are connected in the same mechanism as described above, and further descriptions are hereby omitted. In another embodiment, the first conductive ring 141 and the second conductive ring 151 are made of a conductive material. The first arc-shaped electrode 14 has a plurality of screw threads 1412, and the first conductive ring 141 has a plurality of perforations 1411. No specific number of the perforations 1411 and the screw threads 1412 is defined.

The first arc-shaped electrode 14 and the second arc-shaped electrode 15 are fixed to the first fixture ring 12 by screw bolts. The first arc-shaped electrode 14 and the second arc-shaped electrode 15 have screw holes on top ends thereof, and the first fixture ring 12 has corresponding perforations. When the first fixture ring 12 is fixed to the first arc-shaped electrode 14 and the second arc-shaped electrode 15, the screw bolts perforate through the perforations and are locked into the screw holes, such that the first fixture ring 12 is fixed to the first arc-shaped electrode 14 and the second arc-shaped electrode 15. The bottom ends of the first arc-shaped electrode 14 and the second arc-shaped electrode 15 are fixed to the second fixture ring 16 in the same mechanism as described above, and further descriptions are hereby omitted.

After the above-described parts are assembled, the electrode assembly 1 shown in FIG. 2 is presented.

Figure 3B:
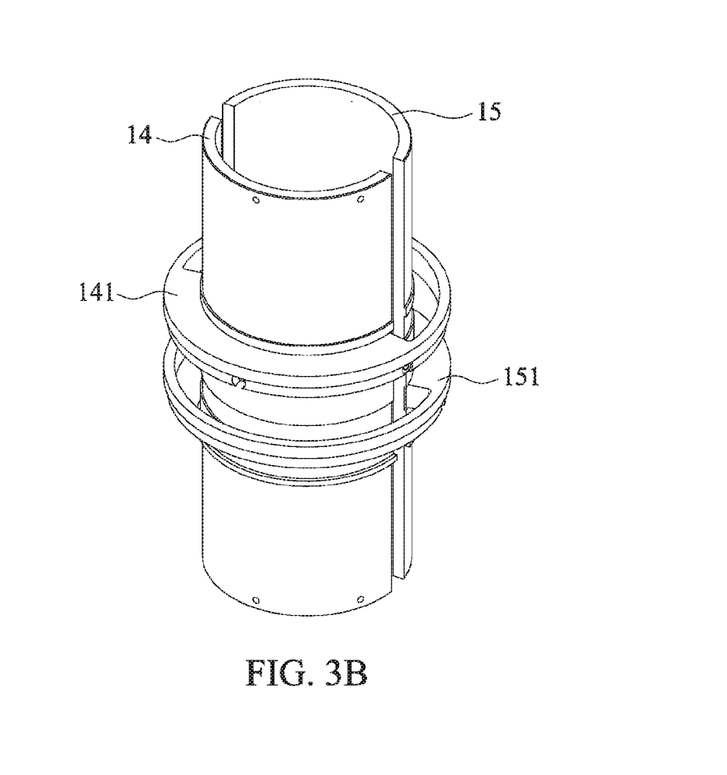
FIG. 3B is a 3-D structural view of the assembled first and second arc-shaped electrodes.
Figure 3C:
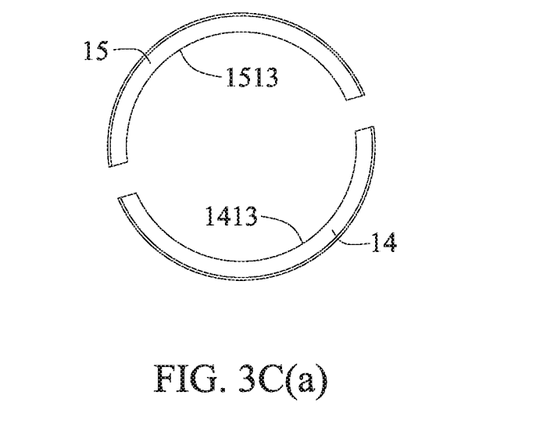

Refer to FIGS. 3B, 3C(a) and 3C(b). As shown in FIG. 3B, a 3-D structural view of the assembled first and second arc-shaped electrodes is disclosed. The first arc-shaped electrode 14 is electrically connected to the first conductive ring 141, and the second arc-shaped electrode 15 is electrically connected to the second conductive ring 151. A gap is formed between the first arc-shaped electrode 14 and the second arc-shaped electrode 15, such that the first conductive ring 141 is not electrically connected to the second arc-shaped electrode 15, and the second conductive ring 151 is not electrically connected to the first arc-shaped electrode 14. The first conductive ring 141 is also separated at a gap from and is not electrically connected to the second conductive ring 151.

As shown in FIGS. 3C(a) and 3C(b), a cross-sectional view of the first and second arc-shaped electrodes of embodiments according to the disclosure is disclosed. In an embodiment, the first arc-shaped electrode 14 has an arc-shaped length 1413 equal to an arc-shaped length 1513 of the second arc-shaped electrode 15, as shown in FIG. 3C(a). In another embodiment, the arc-shaped length 1413 of the first arc-shaped electrode 14 is greater than the arc-shaped length 1513 of the second arc-shaped electrode 15, as shown FIG. 3C(b).

Figure 4A:
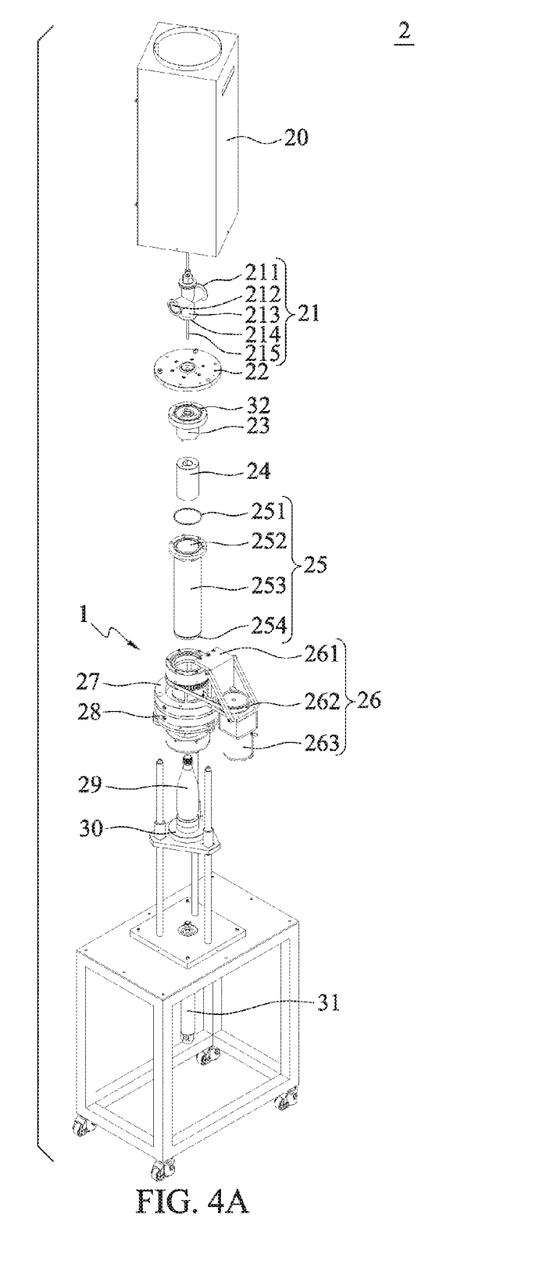
FIG. 4A is an exploded view of a coating apparatus of an embodiment according to the disclosure.
Figure 4B:
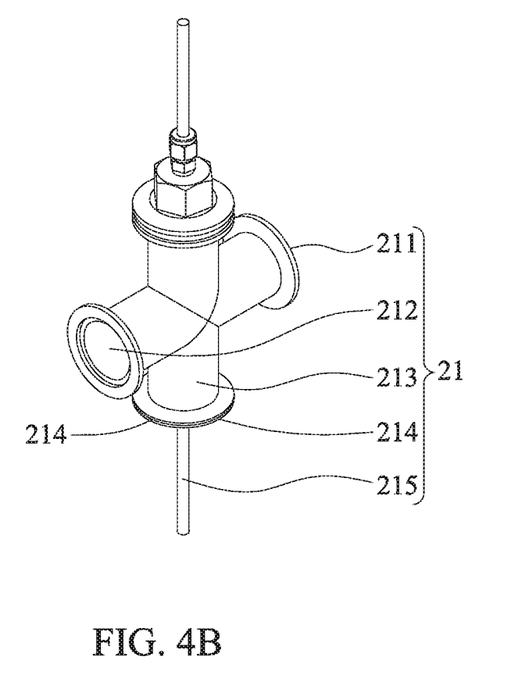
FIG. 4B is an enlarged view of a valve component of the coating apparatus of an embodiment according to the disclosure.
Figure 5:
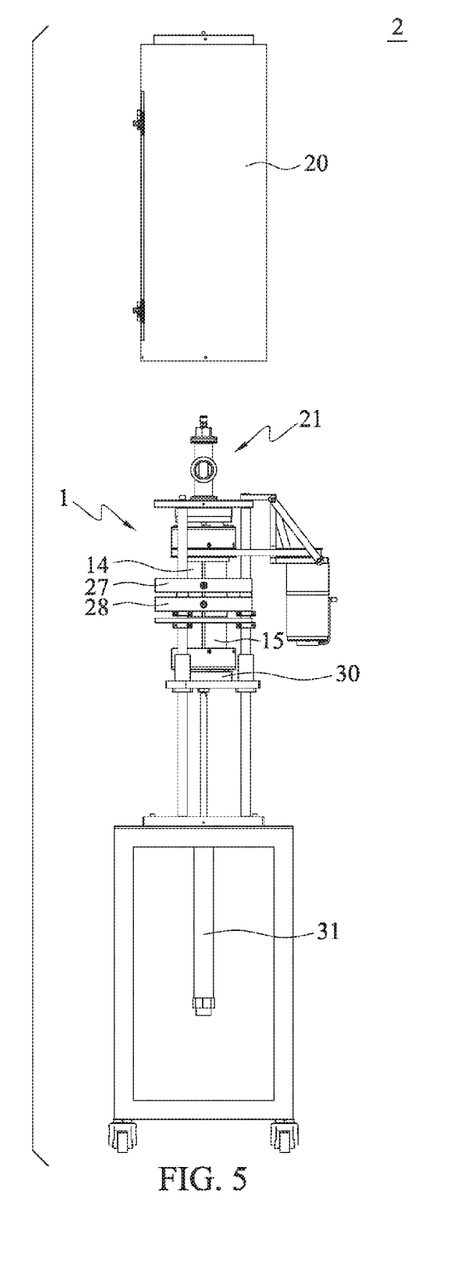
FIG. 5 is an assembled view of the coating apparatus of FIG. 4A.

Refer to FIGS. 4A, 4B and 5. FIG. 4A is an exploded view of a coating apparatus 2 of an embodiment according to the disclosure, and FIG. 4B is an enlarged view of a valve component of the coating apparatus of an embodiment according to the disclosure. FIG. 5 is an assembled view of the coating apparatus 2 of FIG. 4A.

As shown in FIGS. 4A and 4B, the coating apparatus 2 comprises, from top to bottom, a housing 20, a valve component 21, a fixture plate 22, a seal washer 32, an upper supporting seat 23, a container fixture 24, a cylindrical housing 25, a motor assembly 26, a first electric brush 27, a second electric brush 28, a lower supporting seat 30, and an elevation device 31. In an embodiment, the coating apparatus 2 can be placed with a container 29 on the lower supporting seat 30 to coat a film on an inner wall of the container 29.

The housing 20 is used to cover the electrode assembly 1 or other parts during a coating process, to prevent from RF leaking. In an embodiment, the housing 20 is made of a metal material or a conductive material.

The valve component 21 comprises an exhaust pipe 211, a measurement pipe 212, an extraction pipe 213 and a gas duct 215. The exhaust pipe 211 is connected to vacuum pump equipment, and draws gas in the cylindrical housing 25 through the extraction pipe 213. The extraction pipe 213 is connected through the outer screw thread 214 to an inner threaded hole in the middle of the fixture plate 22. The measurement pipe 212 is connected to a pressure meter, to measure the pressure in the cylindrical housing 25. The gas duct 215 is an independent channel that passes through the valve component 21 and protrudes out from an opening of the extraction pipe 213, for providing gas needed during a coating process. In an embodiment, the gas duct 215 is made of an insulating material. In another embodiment, the valve component 21 is made of an insulating material. The types of gas needed during a coating process will be described in the following paragraphs.

The fixture plate 22, the upper supporting seat 23, the container fixture 24, the cylindrical housing 25 and the lower supporting seat 30 are used to fix the container 29, to form a sealed environment. The fixture plate 22 is connected to the upper supporting seat 23 and the extraction pipe 213 of the valve component 21. The upper supporting seat 23 is in the shape of a flange, and the top end of the flange is fixed to the fixture plate 22 by screw bolts (not shown). The seal washer 32 is disposed between the upper supporting seat 23 and the fixture plate 22, and the bottom end of the flange of the upper supporting seat 23 is fixed to a flange of the cylindrical housing 25 by screw bolts (not shown). A seal washer 251 is disposed between the upper supporting seat 23 and the flange of the cylindrical housing 25. The extraction pipe 213 has an outer screw thread 214 disposed on a bottom end thereof and locked in an inner threaded hole in the middle of the fixture plate 22. The fixture plate 22 and the upper supporting seat 23 have a channel therein, allowing the gas duct 215 to pass through the channel and extend into a bottleneck of the container 29. The fixture plate 22 is fixed to a top end of the housing 20 by screw bolts. The container fixture 24 is used for fixing the container 29, and preventing the container 29 from shaking. In an embodiment, the container fixture 24 is made of an insulating material, and has a top end in contact with a bottom end of the upper supporting seat 23. The container fixture 24 has an outer shape corresponding to a neck curve of the container 29, for guiding the body of the container 29 to a certain position. In another embodiment, the container 29 is made of an unconductive material, such as, but not limited to PET, PE, PVC, PE, PP and PS.

The cylindrical housing 25 has a seal washer 251, a first end 252, a containing space 253, and a second end 254. The cylindrical housing 25 is surrounded by the electrode assembly 1. The first end 252 is engaged with the upper supporting seat 23. The container fixture 24 is disposed in the containing space 253. The seal washer 251 is disposed between the upper supporting seat 23 and the first end 252 of the cylindrical housing 25, to prevent gas from leakage. When the lower supporting seat 30 pushes the container 29 by the elevation device 31 into the containing space 253 of the cylindrical housing 25, the lower supporting seat 30 is sealed to the second end 254 of the cylindrical housing 25, to form a sealed environment. A seal washer (not shown) is disposed between the lower supporting seat 30 and the second end 254 of the cylindrical housing 25, to prevent gas from leakage. In an embodiment, the cylindrical housing 25 has an inner radius equal to or slightly greater than an outer radius of the container 29. In another embodiment, the cylindrical housing 25 is made of a polymer material or quartz, has sufficient mechanic characteristic, and can endure a negative pressure of $10^{-3}$ Torr.

The first electric brush 27 is connected to the first conductive ring 141, and connects an RF power supply to the first conductive ring 141 of the electrode assembly 1 through an electric brush (not shown). The second electric brush 28 is connected to the second conductive ring 151, and connects the second conductive ring 151 of the electrode assembly 1 to a ground end through an electric brush (not shown).

The motor assembly 26 comprises a motor assembly 261, a belt 262 and a motor 263. The motor assembly 261 is fixed to the fixture plate 22, and the belt 262 is connected to the motor 263 and the belt pulley 13 (as shown in FIG. 1), such that the motor 263, when operating, transmits power through the belt 262 to the belt pulley 13 of the electrode assembly 1 (as shown in FIG. 1) to rotate the electrode assembly 1. In an embodiment, the motor 263 is, but not limited to a synchronous motor, an induction motor, a reversible motor, a step motor, a servo motor or a linear motor. The motor assembly 26 is disposed with regard to the uneven coated film due to the formation of the gap and the voltage difference between the first arc-shaped electrode 14 and the second arc-shaped electrode 15. Therefore, the motor assembly 26 enables the first arc-shaped electrode 14 and the second arc-shaped electrode 15 to rotate about the cylindrical housing 25, in order to improve the evenness of the coated film. The first conductive ring 141, the second conductive ring 151, the first electric brush 27 and the second electric brush 28 are a conductive structure design that can rotate in accordance with the first arc-shaped electrode 14 and the second arc-shaped electrode 15.

After the above-described parts are assembled, the coating apparatus 2 shown in FIG. 5 is presented.

Figure 6:
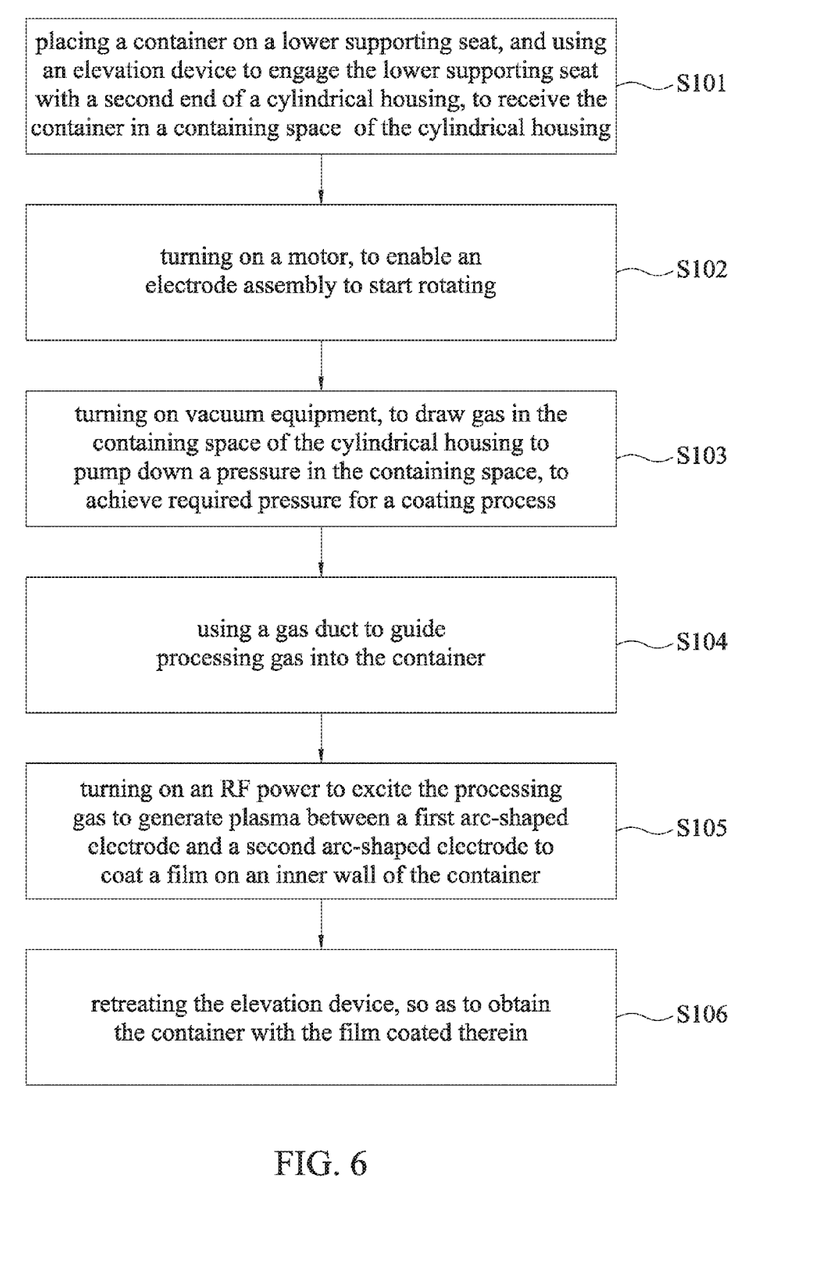
FIG. 6 is a flow chart illustrating a method for coating a film with a coating apparatus of an embodiment according to the disclosure.

Refer to FIG. 6 and FIG. 4A. FIG. 6 is a flow chart illustrating a method for coating a film with a coating apparatus of an embodiment according to the disclosure.

In step S101, the container 29 is placed on the lower supporting seat 30, and the elevation device 31 engages the lower supporting seat 30 with the second end 254 of the cylindrical housing 25, to receive the container 29 in the containing space 253 of the cylindrical housing 25.

In step S102, the motor 263 is turned on, to enable the electrode assembly 1 to start rotating.

In step S103, vacuum equipment (e.g., a pump) is turned on, to draw gas in the containing space 253 of the cylindrical housing 25 to pump down the pressure in the containing space 253, so as to achieve required pressure for the coating process, approximately vacuity. In an embodiment, the required vacuity is between 1 Torr and $10^{-3}$ Torr. In another embodiment, the required vacuity is between 0.5 Torr and $10^{-3}$ Torr.

In step S104, the gas duct 215 guides a processing gas into the container 29. In an embodiment, the processing gas is straight chain hydrocarbon gas (e.g., alkane, alkene and alkyne), oxygen-containing or nitrogen-containing hydrocarbon, or aliphatic hydrocarbon.

In step S105, an RF power is turned on and electrifies the first arc-shaped electrode 14, wherein the second arc-shaped electrode 15 is connected to the ground, to excite the processing gas to generate plasma between the first arc-shaped electrode 14 and the second arc-shaped electrode 15, and coats a film on an inner wall of the container 29. In the period during which the plasma is generated, the electrode assembly 1 rotates at least one circle, to ensure that the coated film of the container 29 is sufficiently even. The thickness of the coated film is proportional to the length of the period during which the plasma is generated, and the evenness of the coated film relates to the rotation speed of the electrode assembly. In short, the rotation speed has to match the plasma generated. For example, when the period during which the plasma is generated is two seconds, the rotation speed of the electrode assembly has to be over 30 RPM; or when the period during which the plasma is generated is one second, the rotation speed of the electrode assembly has to be over 60 RPM. One of ordinary skill in the art can readily adjust the period and the rotation speed on his demand.

In step S106, the elevation device 31 is retreated, so as to obtain the container 29 with the film coated therein.

According to the disclosure, two arc-shaped electrodes are disposed outside a plastic container, in order to solve the problem of existing prior art that the inner electrodes have to be cleaned since they are disposed in the plastic container. Further, the evener coated film can be obtained due to the disposition of the motor assembly, which rotates the two arc-shaped electrodes. Therefore, the coating apparatus and the method for coating a film according to the disclosure reduce the time and cost for coating a film, and improve the competitiveness of the product thus produced in the market.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An apparatus for coating a film in a container, comprising:
    a cylindrical housing having a containing space to contain the container, the containing space penetrating through both ends of the cylindrical housing;
    a first arc-shaped electrode and a second arc-shaped electrode surrounding and covering an outer side of the cylindrical housing with a gap formed between the first arc-shaped electrode and the second arc-shaped electrode such that the first arc-shaped electrode is free from electrically connecting to the second arc-shaped electrode;
    a first conductive ring fixed on the first arc-shaped electrode and a second conductive ring fixed on the second arc-shaped electrode, wherein the first conductive ring and the second conductive ring surround on the first arc-shaped electrode and the second arc-shaped electrode;
    an upper supporting seat and a lower supporting seat disposed at the both ends of the cylindrical housing, respectively, to form a sealed environment for the containing space;
    an RF power configured to electrify the first arc-shaped electrode,
    a first fixture ring and a second fixture ring surrounding and fixed to the first arc-shaped electrode and the second arc-shaped electrode;
    a belt pulley surrounding and fixed to the first fixture ring;
    a motor connected to the belt pulley through a belt, such that the first arc-shaped electrode and the second arc-shaped electrode rotate simultaneously when the first fixture ring rotates; and
    a valve component furnished at the upper supporting seat and inserted into the container for providing a processing gas in a film-coating process,
    wherein the valve component comprises a gas duct protruding into the container, and the second arc-shaped electrode is connected to a ground to excite the processing gas to generate plasma between the first arc-shaped electrode and the second arc-shaped electrode, and coat the film on an inner wall of the container to obtain a coated container.

2. The apparatus of claim 1, wherein the first arc-shaped electrode and the second arc-shaped electrode have a same arc-shaped length.

3. The apparatus of claim 1, wherein the first arc-shaped electrode has an arc-shaped length greater than an arc-shaped length of the second arc-shaped electrode.

4. The apparatus of claim 1, further comprising a radio frequency (RF) power supply and a ground electrode, the first conductive ring and the second conductive ring electrically connected to the RF power supply and the ground electrode, respectively.

5. The apparatus of claim 1, wherein the motor is configured to operate at a minimum rotation speed for the first arc-shaped electrode and the second arc-shaped electrode to rotate one circle within plasma actually stimulating time.

6. The apparatus of claim 1, further comprising an elevation device configured to drive the lower supporting seat to move upward and configured to push the container disposed on the lower supporting seat into the containing space of the cylindrical housing, such that the lower supporting seat is sealed to one end of the cylindrical housing.

7. The apparatus of claim 1, further comprising a container fixture disposed in the containing space of the cylindrical housing and configured to fix the container, wherein the container fixture is made of an insulating material, and has an outer shape corresponding to a neck curve of the container to be received in the containing space.

8. The apparatus of claim 1, wherein the valve component further comprises an exhaust pipe, and wherein the exhaust pipe is connected to a vacuum pump and configured to exhaust gas in the containing space to form a vacuum environment, and the gas duct provides the gas in the film-coating process.

9. The apparatus of claim 1, wherein the cylindrical housing has an inner radius substantially equal to or slightly greater than an outer radius of the container to be received in the containing space.

10. The apparatus of claim 1, wherein the cylindrical housing is made of a polymer material or quartz.

11. The apparatus of claim 1, further comprising a housing configured to cover the cylindrical housing, the first arc-shaped electrode, the second arc-shaped electrode, the first conductive ring, the second conductive ring, the upper supporting seat, the lower supporting seat, and the valve component and to prevent from RF leaking during the film-coating process.

12. The apparatus of claim 11, wherein the housing is made of a metal material or a conductive material.

13. The apparatus of claim 1, further comprising a fixture plate, a plurality of first screw bolts, and a first seal washer, wherein the fixture plate is fixed to an upper end of the upper supporting seat through the plurality of the first screw bolts, and the first seal washer is disposed between the upper supporting seat and the fixture plate.

14. The apparatus of claim 13, wherein the valve component comprises an extraction pipe having an outer screw thread corresponding to an inner threaded hole of the fixture plate.

15. The apparatus of claim 1, further comprising a plurality of second screw bolts and a second seal washer, wherein a lower end of the upper supporting seat is fixed to the cylindrical housing through the plurality of the second screw bolts, and the second seal washer is disposed between the upper supporting seat and the cylindrical housing.

16. The apparatus of claim 1, further comprising a first electric brush and a second electric brush connected to the first conductive ring and the second conductive ring, respectively.

* * * * *